US009817061B2

(12) United States Patent
Reese et al.

(10) Patent No.: US 9,817,061 B2
(45) Date of Patent: Nov. 14, 2017

(54) LINEAR VARIABLE DIFFERENTIAL TRANSFORMER (LVDT) SECONDARY WIRING INTERMITTENT FAILURE MONITOR

(71) Applicant: The Boeing Company, Chicago, IL (US)

(72) Inventors: Glenn R. Reese, Swarthmore, PA (US); Joseph A. Schneider, Havertown, PA (US)

(73) Assignee: The Boeing Company, Chicago, IL (US)

( * ) Notice: Subject to any disclaimer, the term of this patent is extended or adjusted under 35 U.S.C. 154(b) by 129 days.

(21) Appl. No.: 14/801,749

(22) Filed: Jul. 16, 2015

(65) Prior Publication Data

US 2017/0016946 A1   Jan. 19, 2017

(51) Int. Cl.
*G01R 31/02* (2006.01)
*G01R 31/28* (2006.01)
*G01R 31/00* (2006.01)

(52) U.S. Cl.
CPC ....... *G01R 31/2829* (2013.01); *G01R 31/024* (2013.01); *G01R 31/008* (2013.01)

(58) Field of Classification Search
CPC .... G01R 31/005; G01R 31/006; G01R 31/02; G01R 31/021; G01R 31/022; G01R 31/026; G01R 31/083; G01R 31/1272; G01R 31/2812; G01R 31/00; G01R 31/002; G01R 31/024; G01R 31/025; G01R 31/08; G01R 31/28; G01R 31/10; G01R 31/04; G01R 31/2808; G01R 31/2818; G01R 31/023; G01R 31/31901; G01R 31/2805; G01R 31/12; G01R 27/18; G01R 27/2617; G01R 1/0408; G01R 1/06; G01R 1/067; G01R 1/07328; H04L 41/0677; H04B 3/46; H01B 7/328; G01N 27/20; G01N 27/205; H05K 2201/09009; B60L 3/0069; B60L 3/04; B60L 2240/547; B60L 2270/147
See application file for complete search history.

(56) References Cited

U.S. PATENT DOCUMENTS

| | | | | |
|---|---|---|---|---|
| 4,133,250 A | | 1/1979 | Heintz | |
| 4,414,539 A | * | 11/1983 | Armer | G01R 31/008 340/500 |
| 5,777,468 A | * | 7/1998 | Maher | G01D 5/2291 318/657 |

(Continued)

*Primary Examiner* — Patrick Assouad
*Assistant Examiner* — Demetrius Pretlow
(74) *Attorney, Agent, or Firm* — McDonnell Boehnen Hulbert & Berghoff LLP

(57) ABSTRACT

Methods and apparatus are provided for detecting sensor wiring faults. A difference is determined between a high voltage and a low voltage. The high voltage and the low voltage are both related to a sensor that includes a high-voltage wire and a low-voltage wire. A determination is made whether the difference has dropped based on a low-voltage threshold. After determining that the difference has dropped, a fault in the high-voltage wire is indicated. A determination is made whether the difference has risen based on a high-voltage threshold, where the low-voltage threshold is less than the high-voltage threshold. After determining that the difference has risen, a fault in the low-voltage wire is indicated.

20 Claims, 6 Drawing Sheets

(56) References Cited

U.S. PATENT DOCUMENTS

| | | | |
|---|---|---|---|
| 7,138,794 B1 | 11/2006 | Cook et al. | |
| 2007/0146942 A1* | 6/2007 | Covington | G01D 3/08 |
| | | | 361/38 |
| 2012/0290238 A1* | 11/2012 | Nair | G01D 5/24457 |
| | | | 702/65 |

* cited by examiner

LINEAR VARIABLE DIFFERENTIAL TRANSFORMER (LVDT) SECONDARY WIRING INTERMITTENT FAILURE MONITOR

BACKGROUND

Position sensors are utilized in many different applications, including in engines and other components of aeronautical, marine, and industrial applications. Such engines and components can include, for example, linear voltage differential transducers (LVDTs) and other types of transducers, such as rotary voltage differential transducers (RVDTs). Such transducers are coupled to actuators, and provide a voltage signal proportional to a designated position of the actuator: e.g., a position of a ram of the actuator.

To detect faults in a transducer, a test can be performed on a range of sums of secondary voltages from the transducer. A range test also can be performed on a sensed position to verify signal integrity. The limits of the range test may be set wide enough to account for all worse-case system variations so that a properly operating transducer is not improperly identified as being faulty. Wide range limits result in only detecting relatively extreme faults; e.g., faults due to electrical open circuits or short circuits.

SUMMARY

In an example embodiment, a method of detecting faults in sensor wiring is provided. A difference between a high voltage and a low voltage is determined. Both the high voltage and the low voltage are related to a sensor. The sensor includes a high-voltage wire and a low-voltage wire. A determination is made whether the difference has dropped based on a low-voltage threshold. After determining that the difference has dropped, a fault in the high-voltage wire is indicated. A determination is made whether the difference has risen based on a high-voltage threshold, where the low-voltage threshold is less than the high-voltage threshold. After determining that the difference has risen, a fault in the low-voltage wire is indicated.

In another example embodiment, a device is provided. The device includes circuitry that is configured for: determining a difference between a high voltage and a low voltage, where the high voltage and the low voltage are both related to a sensor, and where the sensor includes a high-voltage wire and a low-voltage wire; determining whether the difference has dropped based on a low-voltage threshold; after determining that the difference has dropped, indicating a fault in the high-voltage wire; determining whether the difference has risen based on a high-voltage threshold, where the low-voltage threshold is less than the high-voltage threshold; and after determining that the difference has risen, indicating a fault in the low-voltage wire.

In a further example embodiment, a computing device is provided. The computing device includes one or more processors and computer readable media. The computer readable media is configured to store at least program code that, when executed by the one or more processors, causes the computing device to perform functions. The functions include: determining a difference between a high voltage and a low voltage, where the high voltage and the low voltage are both related to a sensor, and where the sensor includes a high-voltage wire and a low-voltage wire; determining whether the difference has dropped based on a low-voltage threshold; after determining that the difference has dropped, indicating a fault in the high-voltage wire; determining whether the difference has risen based on a high-voltage threshold, where the low-voltage threshold is less than the high-voltage threshold; and after determining that the difference has risen, indicating a fault in the low-voltage wire.

It should be understood that the description provided in this summary section and elsewhere in this document is intended to illustrate aspects of the present disclosure by way of non-limiting example. Generally, the features, functions, components, and advantages that are discussed herein can be achieved independently in various embodiments or may be combined in yet other embodiments, further details of which are disclosed in the following description and the accompanying drawings.

DETAILED DESCRIPTION

Figure 1:
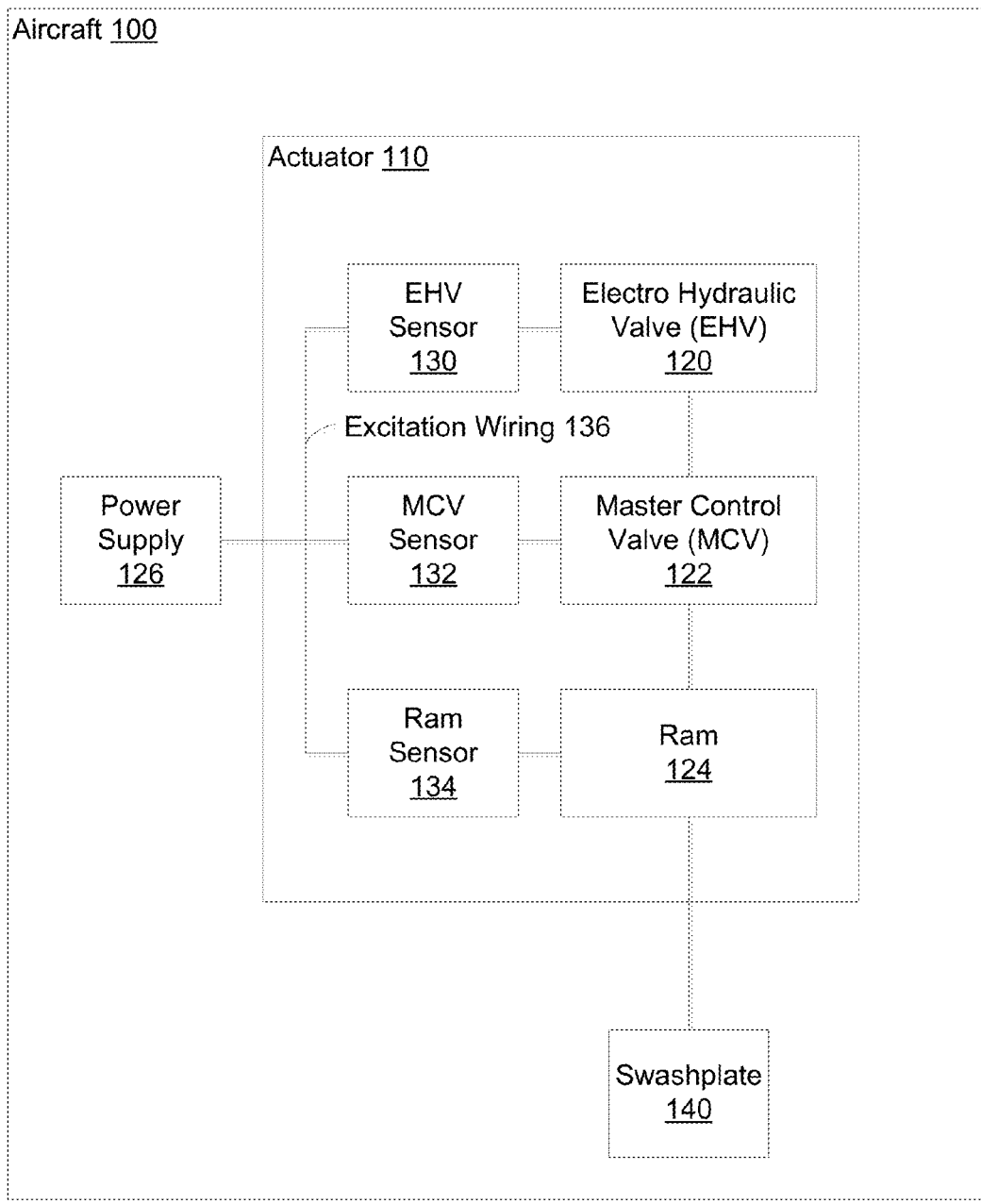
FIG. 1 is a block diagram of an aircraft according to an example embodiment.

Some flight control systems in modern aircraft have fault detection monitors for detecting and isolate component failures. When a failure is detected by a current fault detection monitor, the post-failure troubleshooting procedure can specify execution of a Maintenance Built-In-Test (MBIT) for a failed assembly, such as an actuator, for further isolation once the flight is complete. If the failure involves permanent damage, then the MBIT can correctly isolate the failure to the correct component to be changed or repaired.

Some aircraft, such as rotorcraft, are subject to high vibrations that can lead to intermittent failures, particularly in aircraft wiring, such as wiring of a swashplate actuator that positions a rotor of the rotorcraft. Current fault detection monitors are often unable to distinguish intermittent wiring failures from permanent failures. Intermittent wiring failures can be caused by open circuits, short circuits and transients that are dependent on environmental conditions, such as vibration, temperature, or other dynamic conditions. On the ground, these environmental conditions may not occur, so the intermittent fault does not manifest and makes troubleshooting difficult.

If a failure is an intermittent wiring failure, then the post-flight MBIT may not be able to isolate the fault; e.g., when the fault is not manifest during the MBIT. If the MBIT runs and passes because the intermittent fault is not present during MBIT execution, the aircraft may be cleared to fly because the MBIT has passed. If the intermittent fault occurs for a second time, then troubleshooting procedure can involve a wiring check. Since the fault it is intermittent, the wiring check may well pass, and so the assembly may be replaced. If the fault returns after the assembly is replaced, then a flight control computer (FCC) may be replaced. The loop of checking wiring and replacing the assembly or FCC continues until the intermittent wiring failure is found. This check/replace loop leads to leads to unnecessary and expensive component removal, increased maintenance time, and decreased aircraft readiness. For example, in one rotorcraft, about 20% of removals of swashplate actuators are associated with faults that cannot be duplicated.

Linear Variable Differential Transducers (LVDTs) are used as sensors in the flight control systems to measure position(s) of an assembly, such as an actuator. An excitation voltage is applied to a primary coil of an LVDT. Then, corresponding secondary coil output voltages can be converted to position values for the assembly. For example, a difference between two output voltages ($V_{hi}$ and $V_{lo}$) from the secondary coil can be converted to a position of the assembly. Additionally, a sum of output voltages can be used to monitor LVDT health.

Analysis of historical maintenance records and aircraft data indicates that drops or rises in LVDT difference and sum voltages often are caused by a wiring failure, which is often intermittent. If the wiring failure is in excitation wiring providing the excitation voltage, the LVDT sum voltage will drop for each LVDT using the excitation wiring. If the wiring failure is in secondary wiring of the LVDT, the failure can cause the difference and sum voltages to drop or rise, depending on which of the secondary wires fail.

A sensor wiring monitor is disclosed herein that can detect intermittent failures in LVDT secondary wiring during flight of an aircraft, so aiding troubleshooting. The sensor wiring monitor can detect the response of the difference and sum voltages in an LVDT. If the LVDT difference voltage drops quickly, the sensor wiring monitor can determine that there is likely to be a failure in the secondary coil high side wire. If the LVDT difference voltage rises quickly, the sensor wiring monitor can determine that there is likely to be a failure in the secondary coil low side wire. If the LVDT sum voltage drops quickly while the difference voltage is unchanged, the sensor wiring monitor can determine that there is likely to be a failure in the secondary coil center wire. Therefore, depending on the response of the difference and/or sum voltages to a wiring failure, the sensor wiring monitor can isolate the failure to the correct secondary wire.

If the monitor finds an intermittent fault in LVDT wiring, then the LVDT wiring (e.g., excitation wiring, secondary wiring) can be replaced before replacing actuators and/or FCCs. Detecting and reporting intermittent wiring failures, especially those that occur during flight, can reduce maintenance time, lead to fewer component removals including removals associated with faults that cannot be duplicated, and increase aircraft readiness.

Referring now to the figures, FIG. 1 is a block diagram of aircraft 100 according to an example embodiment. Aircraft 100 includes actuator 110, power supply 126, and swashplate 140. Actuator 110 is connected to, and configured to move, swashplate 140, and is also connected to, and configured to receive power from power supply 126. In some embodiments, power supply 126 can be part of actuator 110.

In the embodiment shown in FIG. 1, actuator 110 is a hydraulically powered position control servo that includes electro-hydraulic valve (EHV) 120, master control valve (MCV) 122, and ram 124. Fluid flow from EHV 120 can move or operate MCV 122. MCV 122 governs fluid connections within actuator 110 including the fluid flow to ram 124 in order to control a position of swashplate 140. To move swashplate 140, ram 124 can be coupled via a mechanical connection device to an external member to effect position control of swashplate 140 as position or displacement from a reference location of ram 124 changes.

For actuator 110, a position of EHV 120 can be monitored by EHV sensor 130, a position of MCV 122 can be monitored by MCV sensor 132, and a position of ram 124 can be monitored by ram sensor 134. Each of EHV sensor 130, MCV sensor 132, and ram sensor 134 can be powered by power supply 126 via power conveyed by excitation wiring 136.

Figure 2:
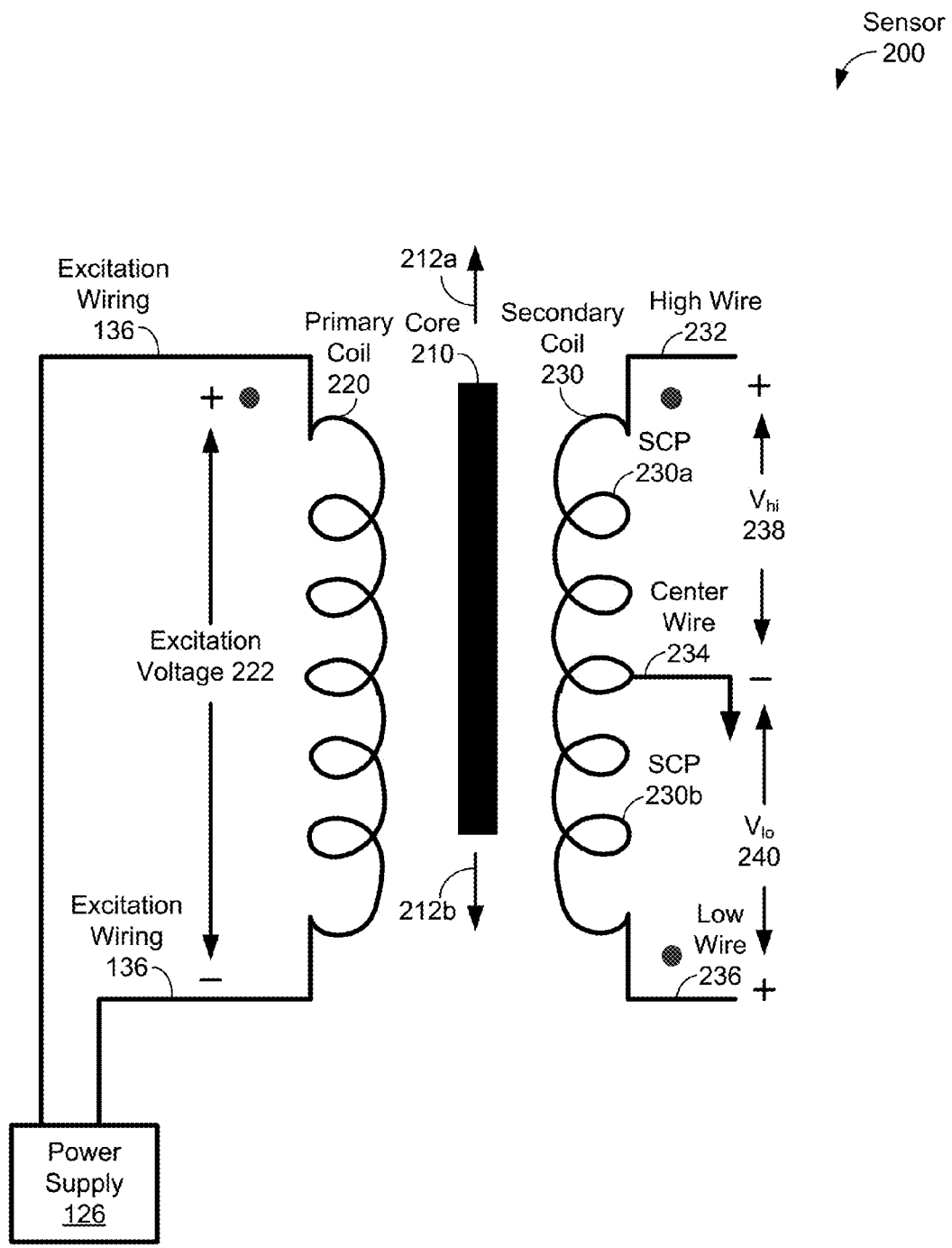
FIG. 2 is a diagram of a sensor according to an example embodiment.

FIG. 2 is a diagram of sensor 200 according to an example embodiment. One or more sensors 200 can be utilized to perform the functionality of EHV sensor 130, MCV sensor 132, and ram sensor 134; e.g., one sensor 200 can be used as EHV sensor 130, a second sensor 200 can be used as MCV sensor 132, and a third sensor 200 can be used as ram sensor 134.

Sensor 200 can be a LVDT that includes core 210, primary coil 220, and secondary coil 230. Primary coil 220 can receive power from power supply 126 via excitation wiring 136 and can cause voltage drop shown in FIG. 2 as excitation voltage 222. Current flowing through primary coil 220 can induce an induction current to flow through secondary coil 230. Secondary coil 230 includes three wires: high wire 232, center wire 234, and low wire 236. As shown in FIG. 2, a voltage drop of $V_{hi}$ 238 can occur between high wire 232 and center wire 234, and a voltage drop of $V_{lo}$ 240 can occur between center wire 234 and low wire 236. Core 210 can be made up of a magnetically permeable material (e.g., nickel-iron, iron, ferrite, nickel steel) moving along an axis within sensor 220 as indicated in FIG. 2 by vertical arrows 212a and 212b.

Movements by core 210 along the axis can cause changes in $V_{hi}$ 238 and $V_{lo}$ 240. Suppose that core 210 moves up with respect to FIG. 2; e.g., in the direction of arrow 212a. An upward movement of core 210 can cause core 210 to move closer to secondary coil portion 230a than to secondary coil portion 230b and correspondingly cause more magnetic flux and more power to be conveyed to secondary coil portion 230a relative to secondary coil portion 230b. As core 210 moves up within sensor 200, $V_{hi}$ 238 can increase relative to $V_{lo}$ 240 until core 210 reaches to an uppermost position within sensor 200, where $V_{hi}$ 238 reaches its maximum relative value compared to $V_{lo}$ 240.

In another example, suppose core 210 moves down with respect to FIG. 2; e.g., in the direction of arrow 212b. A downward movement of core 210 can cause core 210 to move closer to secondary coil portion 230b than to secondary coil portion 230a and correspondingly cause more magnetic flux and more power to be conveyed to secondary coil portion 230b relative to secondary coil portion 230a. As core 210 moves down within sensor 200, $V_{lo}$ 240 increases relative to $V_{hi}$ 238 until core 210 reaches to an lowermost position within sensor 200, where reaches $V_{lo}$ 240 its maximum relative value compared to $V_{hi}$ 238.

Figure 3:
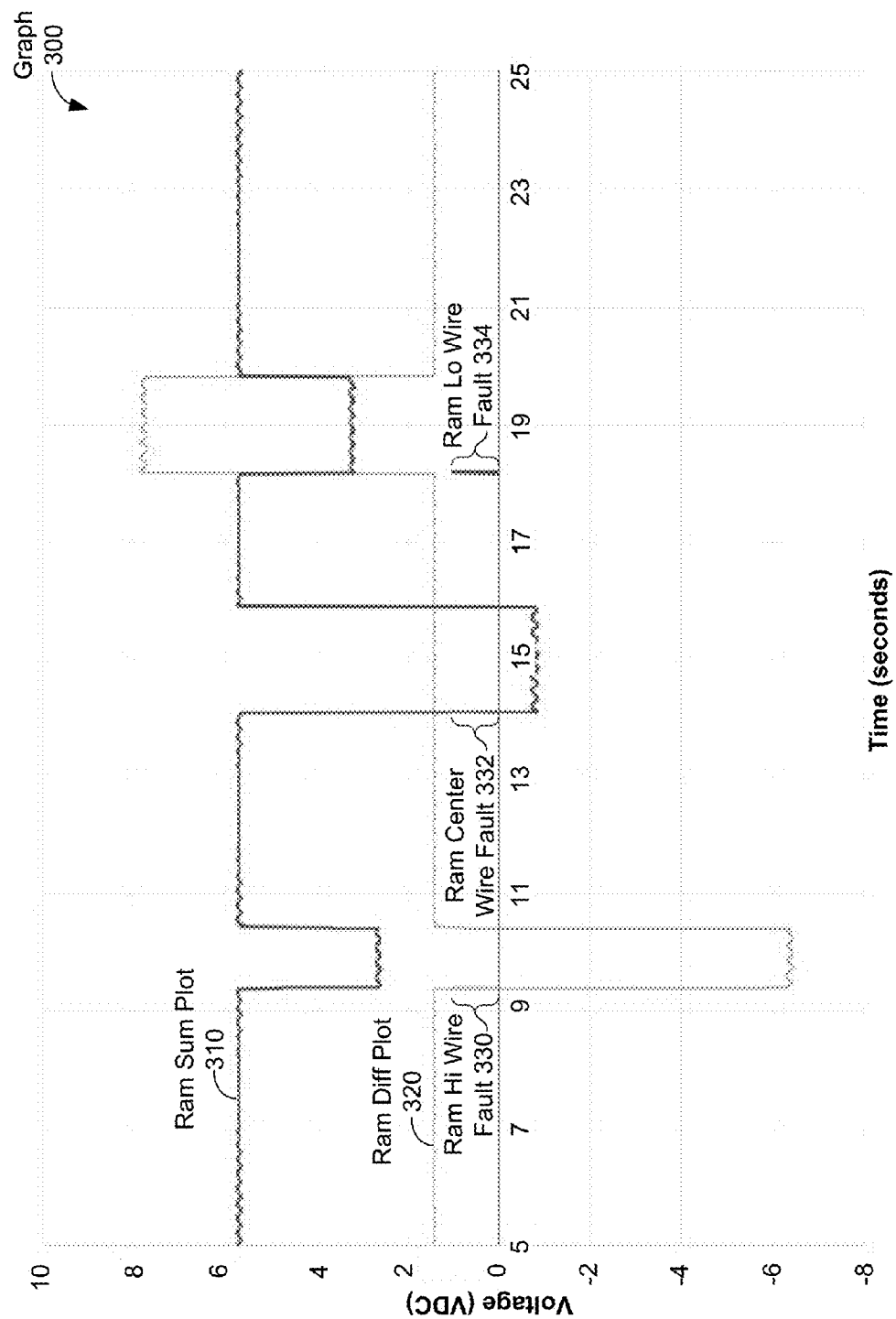
FIG. 3 illustrates a graph with voltage sum and voltage difference plots related to a sensor of a ram of an actuator according to an example embodiment.

FIG. 3 illustrates a graph 300 with voltage sum plot 310 and voltage difference plot 320 related to a sensor of a ram of an actuator according to an example embodiment. The sensor can be a LVDT, such as sensor 200 discussed above with respect to FIG. 2. Graph 300 includes of the voltage sum and voltage difference for the sensor along a vertical (Y) axis as a function of time plotted along a horizontal (X) axis. The voltage sum (sum) can be calculated as: sum=$V_{hi}$+$V_{lo}$, where $V_{hi}$ and $V_{lo}$ are, respectively, high and low voltages from the sensor. And the voltage difference (diff) can be calculated as: diff=$V_{hi}$-$V_{lo}$. FIG. 3 shows ram sensor voltage sum plot 310 using a relatively dark plot color an shows ram sensor voltage difference plot 320 using a relative light color over a time interval of about 20 seconds from t=5 seconds to t=25 seconds.

A fault in a high wire of the sensor, such as high wire 232 of FIG. 2, can cause a drop in the voltage difference from the sensor. For example, suppose that prior to the high wire fault that $V_{hi}>0$, and that the high wire fault causes a short circuit. As no voltage drop is registered across the short circuit, the value of $V_{hi}$ will be reduced to 0, and so the voltage difference $V_{hi}-V_{lo}$ can correspondingly decrease. An example of a high wire fault is shown by FIG. 3 at about t =9.3 seconds as indicated by ram high wire fault 330. At that time (t=9.3 seconds), ram difference plot 320 shows an immediate decrease from about +1.6V to about −6.2V.

A fault in a low wire of the sensor, such as low wire 236 of FIG. 2, can cause a rise in the voltage difference from the sensor. For example, suppose that prior to the low wire fault that $V_{hi}>V_{lo}$ with $V_{lo}>0$, and that the low wire fault causes a short circuit. As no voltage drop is registered across the short circuit, the value of $V_{lo}$ will be reduced to 0, and so the voltage difference $V_{hi}-V_{lo}$ can correspondingly increase. An example low wire fault is shown by FIG. 3 at about t=18.3 seconds as indicated by ram low wire fault 334. At that time (t=18.3 seconds), ram difference plot 320 shows an immediate increase from about +1.6V to about +7.8V.

A fault in a center wire of the sensor, such as low wire 236 of FIG. 2, can cause a drop in a voltage sum of the sensor with no corresponding change in the sensor's voltage difference. An example center wire fault is shown by FIG. 3 at about t=14.0 seconds as indicated by ram center wire fault 332. At that time (t=14.0 seconds), ram difference plot 320 remains at about a +1.6V level, while ram sum plot 310 shows an immediate decrease from about +5.6V to about −0.8V.

Figure 4:
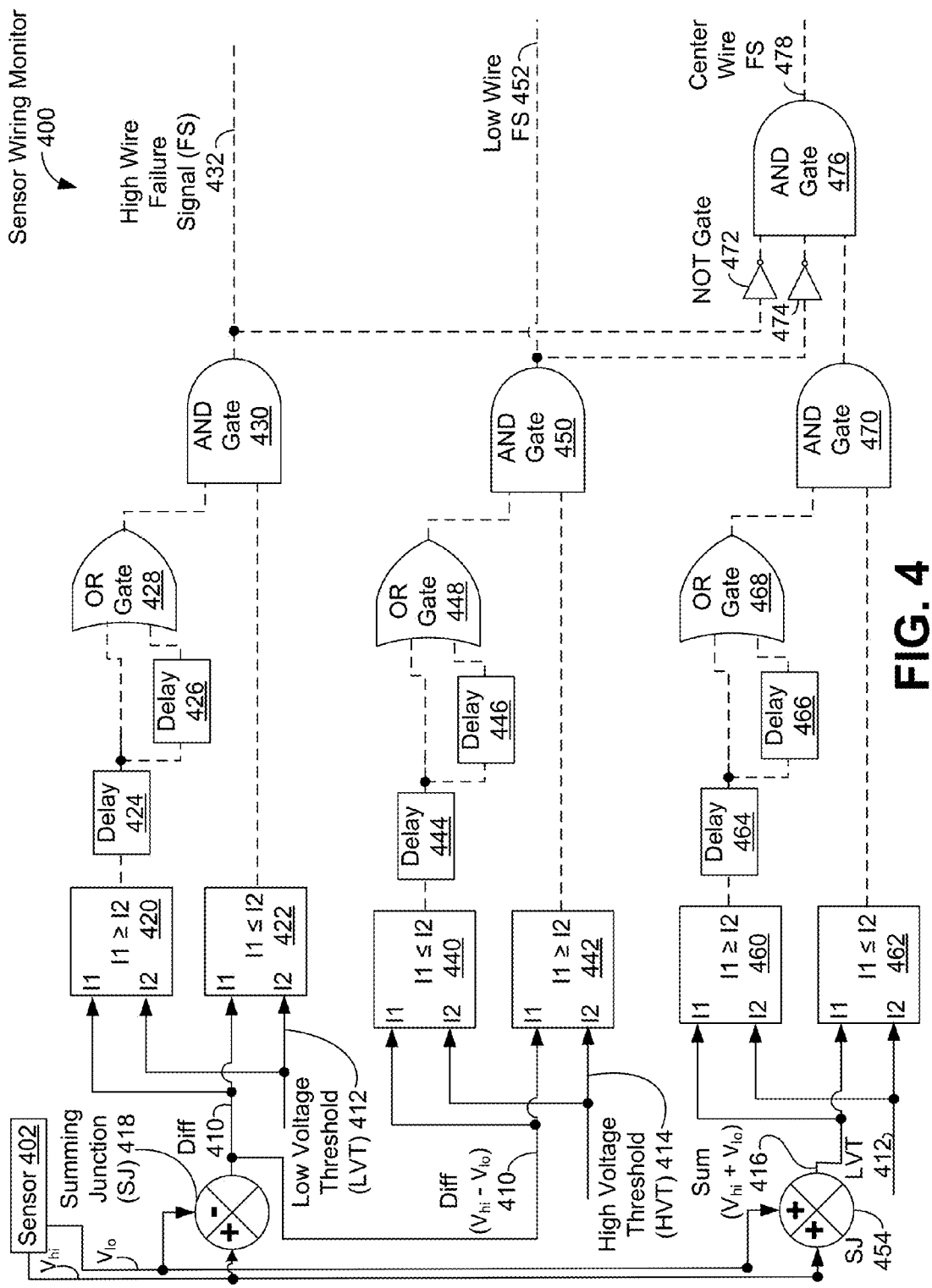
FIG. 4 is a circuit diagram for a sensor wiring monitor according to an example embodiment.

FIG. 4 is a circuit diagram for sensor wiring monitor 400 according to an example embodiment. In the embodiment shown in FIG. 4, sensor wiring monitor 400 monitors wiring of sensor 402, which produces $V_{hi}$ and $V_{lo}$ voltages and includes at least a low wire, a center wire, and a high wire, where the $V_{hi}$ voltage is associated with the high wire and the $V_{lo}$ voltage is associated with the low wire. For example, sensor 402 can be an LVDT such as sensor 200 shown in FIG. 2.

As shown at upper left of FIG. 4, sensor 402 produces $V_{hi}$ and $V_{lo}$ voltages. The $V_{hi}$ and $V_{lo}$ voltages are provided to summing junction 418 at upper left of FIG. 4 and summing junction 454 at lower left of FIG. 4. Summing junction 418 is configured to determine voltage difference diff 410, with diff $410=V_{hi}-V_{lo}$.

At upper left of FIG. 4, diff 410 and low voltage threshold (LVT) 412 are provided to comparators 420 and 422. LVT 412 can be a value that represents a minimum expected value of diff 410 when sensor 402 is fault-free; e.g., 0.0V, +1.6V, −2.0V. LVT 412 can be a predetermined value, such as a constant value, a value based on a core position of sensor 402, or otherwise be determined/calculated.

Comparator 420 takes diff 410 as input I1 and LVT 412 as input I2 and outputs a logical TRUE value if I1 (diff 410)≥I2 (LVT 412) or outputs a logic FALSE value if I1<I2. In contrast, comparator 422 takes diff 410 as input I1 and low voltage threshold 412 as input I2 and outputs a logical TRUE value if I1 (diff 410)≤I2 (LVT 412) or outputs a logic FALSE value if I1>I2.

The output of comparator 420 is passed to delay 424. Delay 424 can act to output its input value after a delay of one (or more) interval(s) of time. For example, suppose that delay 424 outputs its input value after a constant delay of I intervals of time; e.g., I=1, 2, or some other positive value, and where an interval of time can be a number of seconds, clock cycles, or other units of time; e.g., 2 clock cycles, 1.5 nanoseconds, one or more iterations of a software loop, etc. Then, the output of delay 424 at a time t+I will correspond to an output of comparator 420 at time t. The output of delay 424 is provided to both delay 426 and OR gate 428. For example, if both delay 424 and delay 426 cause a constant delay of I intervals of time before outputting an input value, then the respective inputs to OR gate 428 at time t+2I will be the outputs of comparator 420 at respective times t and t+I.

OR gate 428 then takes the logical OR of its two inputs corresponding to the output of delay 424 and the output of delay 426. That is, the output of OR gate 428 will be a logical TRUE value at time t+2I if the output of comparator 420 was a logical true value at either time t or time t+I, which corresponds to the condition that diff 410 exceeded or equaled LVT 412 at either time t or time t+I.

The outputs of OR gate 428 and comparator 422 are both passed to AND gate 430 as inputs. AND gate 430 generates a logical TRUE value if both of its inputs are logical TRUE values. Continuing the example mentioned above, at time t+2I, AND gate 430 can generate a logical TRUE value if the condition that diff 410 exceeded or equaled LVT 412 at either time t or time t+I is true (corresponding to a logical TRUE value output of OR gate 428) and the condition that diff 410 was less than or equal to LVT 412 at time t+2I (corresponding to a logical TRUE value output of comparator 422). Otherwise, AND gate 430 can generate a logical FALSE value.

That is, the output of AND gate 430 is a logical TRUE value only if diff 410 dropped from being greater than or equal to LVT 412 at time t or t+I to being less than or equal to LVT 412 at time t+2I. As such, this drop in diff 410 can indicate a high wire failure such as discussed above in the context of FIG. 3. Therefore, the output of AND gate 430 can be used as high wire failure signal (FS) 432.

At center left of FIG. 4, diff 410 and high voltage threshold (HVT) 414 are provided to comparators 420 and 422. HVT 414 can be a value that represents a maximum expected value of diff 410 when sensor 402 is fault-free; e.g., +6.6V, +2.0V, 0.0V. HVT 414 can be a predetermined value, such as a constant value, a value based on a core position of sensor 402, or otherwise be determined/calculated.

Comparator 440 takes diff 410 as input I1 and HVT 414 as input I2 and outputs a logical TRUE value if I1 (diff 410)≤I2 (HVT 412) or outputs a logic FALSE value if I1>I2. In contrast, comparator 442 takes diff 410 as input I1 and low voltage threshold 412 as input I2 and outputs a logical TRUE value if I1 (diff 410)≥I2 (LVT 412) or outputs a logic FALSE value if I<I2.

The output of comparator 440 is passed to delay 444. Delay 444 can act to output its input value after a delay of one (or more) interval(s) of time, such as discussed above in more detail regarding delay 424. The output of delay 444 is provided to both delay 446 and OR gate 448. For example, if both delay 444 and delay 446 cause a constant delay of I intervals of time (for I>0) before outputting an input value, then the respective inputs to OR gate 448 at time t+2I will be the outputs of comparator 440 at respective times t and t+I.

OR gate 448 then takes the logical OR of its two inputs corresponding to the output of delay 444 and the output of delay 446. The output of OR gate 448 will be a logical TRUE value at time t+2I if the output of comparator 440 was a logical true value at either time t or time t+I, which corresponds to the condition that HVT 414 exceeded or equaled diff 410 at either time t or time t+I.

The outputs of OR gate 448 and comparator 442 are both passed to AND gate 450 as inputs. AND gate 450 generates a logical TRUE value if both of its inputs are logical TRUE values. Continuing the example mentioned above, at time t+2I, AND gate 450 can generate a logical TRUE value if the condition that HVT 414 exceeded or equaled diff 410 at either time t or time t+I is true (corresponding to a logical TRUE value output of OR gate 448) and the condition that HVT 414 was less than or equal to diff 410 at time t+2I (corresponding to a logical TRUE value output of comparator 442). Otherwise, AND gate 450 can generate a logical FALSE value.

That is, the output of AND gate 450 is a logical TRUE value only if diff 410 rose to being greater than or equal to HVT 414 at time t+2I after being less than or equal to HVT 414 at time t or t+I. As such, this rise in diff 410 can indicate a low wire failure such as discussed above in the context of FIG. 3. Therefore, the output of AND gate 450 can be used as low wire failure signal 452.

At lower left of FIG. 4, summing junction 454 is configured to determine voltage sum 416, with sum $416 = V_{hi} + V_{lo}$. Sum 416 and LVT 412 are provided to comparators 460 and 462. Comparator 460 takes sum 416 as input I1 and LVT 412 as input I2 and outputs a logical TRUE value if I1 (sum 416)≥I2 (LVT 412) or outputs a logic FALSE value if I1<I2. In contrast, comparator 462 takes sum 416 as input I1 and low voltage threshold 412 as input I2 and outputs a logical TRUE value if I1 (sum 416)≤I2 (LVT 412) or outputs a logic FALSE value if I1>I2.

The output of comparator 460 is passed to delay 464. Delay 464 can act to output its input value after a delay of one (or more) interval(s) of time, as discussed above in more detail with respect to delay 424. The output of delay 464 is provided to both delay 466 and OR gate 468. For example, if both delay 464 and delay 466 cause a constant delay of I (for I>0) intervals of time before outputting an input value, then the respective inputs to OR gate 468 at time t+2I will be the outputs of comparator 460 at respective times t and t+I.

OR gate 468 then takes the logical OR of its two inputs corresponding to the output of delay 464 and the output of delay 466. That is, the output of OR gate 468 will be a logical TRUE value at time t+2I if the output of comparator 460 was a logical true value at either time t or time t+I, which corresponds to the condition that sum 416 exceeded or equaled LVT 412 at either time t or time t+I.

The outputs of OR gate 468 and comparator 462 are both passed to AND gate 470. AND gate 470 generates a logical TRUE value if both of its inputs are logical TRUE values. Continuing the example mentioned above, at time t+2I, AND gate 470 can generate a logical TRUE value if the condition that sum 416 exceeded or equaled LVT 412 at either time t or time t+I is true (corresponding to a logical TRUE value output of OR gate 468) and the condition that sum 416 was less than or equal to LVT 412 at time t+2I (corresponding to a logical TRUE value output of comparator 462). Otherwise, AND gate 470 can generate a logical FALSE value.

That is, the output of AND gate 470 is a logical TRUE value only if sum 416 dropped from being greater than or equal to LVT 412 at time t or t+I to being less than or equal to LVT 412 at time t+2I. As such, this drop in sum 416 can provide an indication of possible center wire failure such as discussed above in the context of FIG. 3.

The output of AND gate 470 and negated outputs of AND gates 430 and 450 are provided as inputs to AND gate 476. AND gate 476 can generate a logical TRUE value if all of its inputs have logical TRUE values; otherwise, AND gate 476 can generate a logical FALSE value. The negated output of AND gate 430 will have a logical TRUE value if either diff 410 was less than LVT 412 at either time t or time t+I or diff 410 was greater or equal to than LVT 412 at time t+2I. The negated output of AND gate 450 will have a logical TRUE value if either diff 410 was greater than HVT 414 at either time t or time t+I or diff 410 was less than HVT 414 at time t+2I. The negated outputs of AND gates 430 and 450 can both be logically TRUE only if diff 410 was both greater than LVT 412 at time t+2I and less than HVT 414 at time t+2I. That means that, if HVT 414>LVT 412, then the negated outputs of AND gates 430 and 450 can both be logically TRUE if and only if HVT 414>diff 410>LVT 412 at time t+2I.

Further, the output of AND gate 470, which is the third input to AND gate 476, can only be a logical TRUE value if sum 416 dropped from being greater than or equal to LVT 412 at time t or t+I to being less than or equal to LVT 412 at time t+2I. Therefore, AND gate 476 can only have a logical true value if (a) HVT 414>diff 410>LVT 412 at time t+2I AND (b1) sum 416 dropped from being greater than or equal to LVT 412 at time t or t+I to being less than or equal to LVT 412 at time t+2I. That is, AND gate 476 will have logical TRUE output at time t+2I when (a) diff 410 was between the high and low voltage thresholds 412, 414 and (b) sum 416 dropped below low voltage threshold 412. This condition where the voltage difference remains the same (or at least within tolerances) but the voltage sum drops is an indication of a center wire failure as discussed above in the context of FIG. 3, and so the output of AND gate 476 can be used as center wire failure signal 478.

In some embodiments, fewer wires, such as only the high and low wires, can be monitored by sensor wiring monitor 400. In those embodiments, the circuit for generating center wire failure signal 478 that includes summing junction 454, comparators 460 and 462, delays 464 and 466, OR gate 468, AND gate 470, NOT gates 472 and 474 (and their respective connections to high wire failure signal 432 and low wire failure signal 452), and AND gate 476 may be absent from sensor wiring monitor 400.

Figure 5:
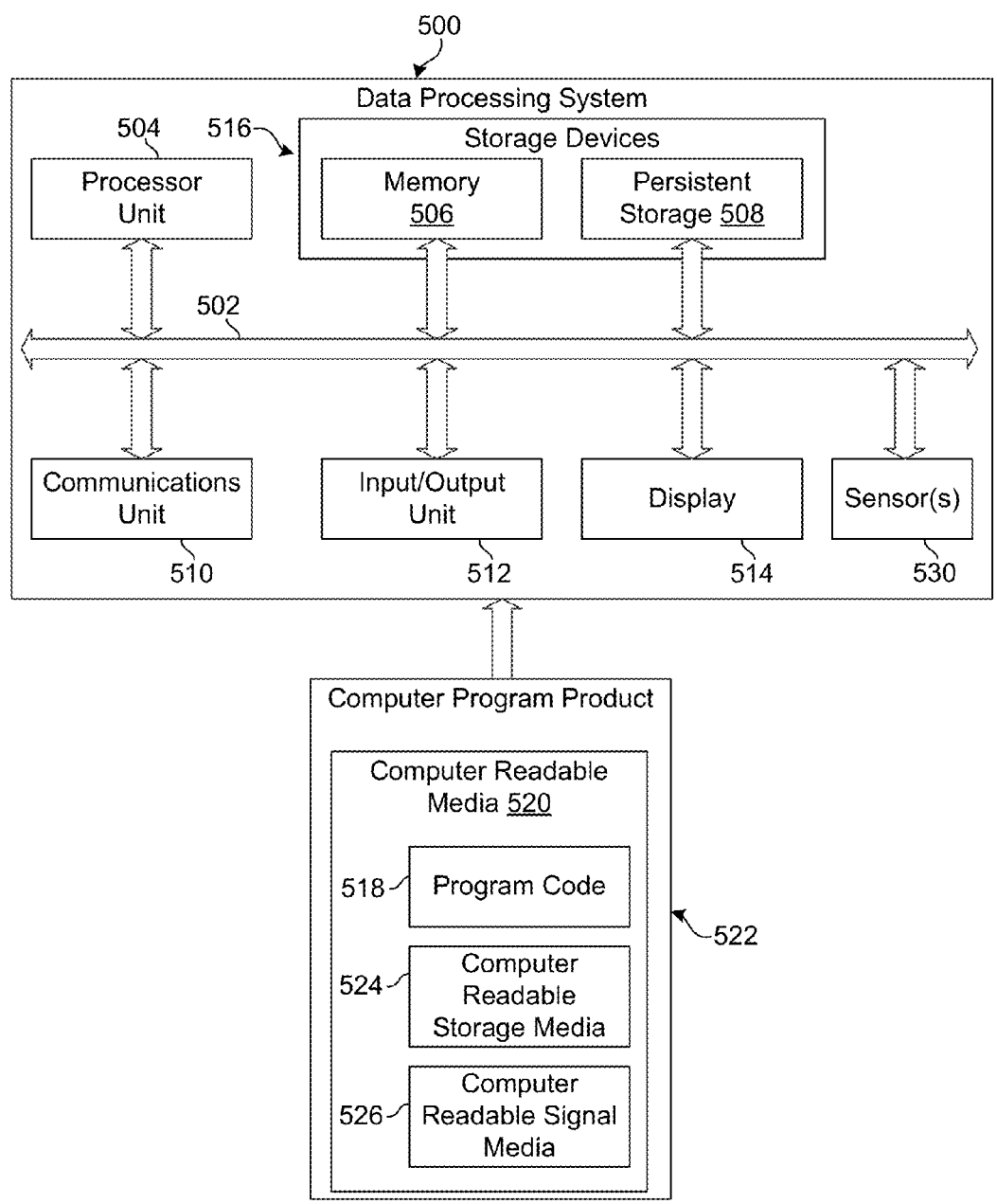
FIG. 5 is a block diagram of a data processing system according to an example embodiment.

FIG. 5 is a block diagram of data processing system 500 according to an example embodiment. In FIG. 5, data processing system 500 includes bus 502 that is configured for communicatively coupling processor unit 504, memory 506, persistent storage 508, communications unit 510, input/output (I/O) unit 512, and display 514.

In the present example, processor unit 504 is configured to execute software instructions that can be stored in memory 506. Processor unit 504 can include one or more high performance programmable processors, multi-core processors, or other types of processors.

Memory 506 and persistent storage 508 are examples of storage devices 516. Generally, a storage device is hardware that is capable of storing information; for example, data, program code, and/or other suitable information on a temporary basis and/or a permanent basis. Memory 506, in these examples, can be a random access memory (RAM) or any other suitable volatile or non-volatile storage device. Persistent storage 508 can be a hard drive, a flash memory, a rewritable optical disk, a rewritable magnetic tape, or some combination of the above. Media used by persistent storage 508 also can be removable, such as a removable hard drive, removable disk, or flash memory.

Communications unit 510, in these examples, can be configured to enable communications between data processing system 500 with other data processing systems or devices. For instance, communications unit 510 can be a network interface card. Generally, communications unit 510 can provide communications through physical links (e.g., wired links, fiber links) and/or wireless links.

Input/output unit 512 is configured to enable input and output of data with other devices that can be connected to the data processing system 500. For example, input/output unit 512 can enable user input through a keyboard, a mouse, a touchpad, a microphone for receiving voice commands, and/or other suitable input device(s) (e.g., keypads, buttons, game controllers, joysticks). Input/output unit 512 can send output to a printer, display 514, and/or other suitable output device(s) (e.g., speakers, haptic interface devices). Display 514 is configured to output visual information, including, but not limited to, text and imagery; for example, display 514 can include one or more liquid crystal displays (LCD), light emitting diodes (LEDs), displays using digital light processing (DLP) technology, cathode ray tubes (CRTs), and/or other similar devices.

Instructions for software, such as an operating system, applications, and/or other programs, can be located in storage devices 516, which can communicate with processor unit 504 through bus 502. Generally, the processes and functions of the disclosed embodiments can be performed by processor unit 504 using computer-readable instructions stored in a functional form on different physical or tangible computer readable media, such as memory 506 and/or persistent storage 508. The computer-readable instructions are referred to as program code, computer usable program code, or computer readable program code that can be read and executed by a processor in processor unit 504.

FIG. 5 also illustrates that program code 518 can be located in a functional form on computer readable media 520. Computer readable media 520 can be selectively removable and can be loaded onto or transferred to data processing system 200 for execution by processor unit 504. In the present example, program code 518 and computer readable media 520 form computer program product 522. Computer readable media 520 can include computer readable storage media 524 or computer readable signal media 526. Computer readable storage media 524 can take various forms, such as an optical or magnetic disk, a hard drive, a thumb drive, or a flash memory, that is connected to data processing system 500. In some instances, computer readable storage media 524 may be a non-transitory computer-readable storage medium.

Alternatively, program code 518 can be transferred to data processing system 500 using computer readable signal media 526. Computer readable signal media 526 can be, for example, a propagated data signal containing program code 518. For example, computer readable signal media 526 can be an electromagnetic signal, an optical signal, and/or any other suitable type of signal. Computer readable signal media 526 can be transmitted over wireless communications links, optical fiber cable, coaxial cable, a wire, and/or any other suitable type of communications link.

Sensor(s) 530 can be configured to measure conditions in an environment for data processing system 500 and provide data about that environment. The data can include, but is not limited to, location data about data processing system 500 (including, but not limited to, latitude, longitude, and/or altitude data), velocity (speed, direction) data about data processing system 500, acceleration data about computing device, and other data about the environment for data processing system 500, meteorological data about the environment (e.g., air temperature, humidity, barometric pressure, wind speed), and electromagnetic radiation data (e.g., infra-red, ultra-violet, X-ray data). Sensors 530 can include, but are not limited to, GPS sensor(s), location sensors(s), gyroscope(s), accelerometer(s), magnetometer(s), camera (s), light sensor(s), infrared sensor(s), ultraviolet sensor(s), X-ray sensor(s), meteorological sensor(s), and microphone(s).

The different components illustrated for the data processing system 500 are not meant to provide architectural limitations to the manner in which different embodiments can be implemented. Different embodiments can be implemented in a data processing system including components in addition to or in place of those illustrated for data processing system 500. Other components shown in FIG. 5 can be varied from the illustrative examples shown; e.g., program code 518 can be stored within memory 506. Generally, the different embodiments can be implemented using any hardware device or system capable of running program code.

In some embodiments, program code 518 can include instructions that cause data processing system to receive data from sensor(s) 530 to perform the functionality of sensor wiring monitor 400. For example, program code 518 can include computer-readable and executable instructions corresponding to the instructions shown in pseudo-code format in Table 1 to perform some or all of the functions of sensor wiring monitor 400.

TABLE 1

```
0001 // function to determine fault signals 432, 452, and output of AND gate 470
0002 Get_FS(I1, I2, I2_type, * Delay1, * Delay2)
0003 {
0004      local compare1, compare2, OR_out, AND_out;
0005
0006      // if I2_type == 0, doing LO comparison where I2 is low (LVT 412);
0007      // otherwise doing HI comparison where I2 is high (HVT 414)
0008
0009      if (I2_type == 0) // if doing low comparison of comparators 420/422 or 460/462
0010      {
0011              compare1 = (I1 >= I2); // operation of comparator 420 or 460
0012              compare2 = (I1 <= I2); // operation of comparator 422 or 462
0013      } else {        // else doing high comparison of comparators 440/442
0014              compare1 = (I1 <= I2); // operation of comparator 440
0015              compare2 = (I1 >= I2); // operation of comparator 442
0016      }
0017
0018      // perform operation of OR gate 428, 448, 468 and then update delay values
0019      OR_out = ((*Delay1) || (*Delay2));
0020      (*Delay2) = (*Delay1); // Delay2 corresponds to output of Delay 426/446/466
0021      (*Delay1) = compare1; // Delay1 corresponds to output of Delay 424/444/464
0022
```

TABLE 1-continued

```
0023         // return output of AND gate 430, 450, 470
0024         AND_out = ((OR_out) && (compare2));
0025         return(AND_out);
0026 } // end of Get_FS
0027
0028 done_yet( ) // function to decide if monitor_loop function is done
0029 {
0030         return(FALSE); // always return not done
0031         // done_yet can be more complex in other embodiments
0032 }
0033
0034 Get_LVT( ) // function for determining low voltage threshold 412
0035 {
0036         return(1.0); // always return 1.0 -> value based ram diff plot 320
0037         // Get_LVT can be more complex in other embodiments
0038 }
0039
0040 Get_HVT( ) // function for determining high voltage threshold 414
0041 {
0042         return(6.0); // always return 6.0 -> value based ram sum plot 310
0043         // Get_HVT can be more complex in other embodiments
0044 }
0045
0046 // main function for performing functionality of sensor wiring monitor 400
0047 SW_monitor( )
0048 {
0049         // declarations / initializations
0050         local done = FALSE; // monitoring loop not done yet
0051         local LVT_412, HVT_414; // low value threshold 412 and high value threshold 414
0052         local vlo, vhi, diff_410, sum_416; // voltage lo, hi, diff, and sum values
0053         local I2_LOW = 0; // value to indicate I2 variable is supposed to be low
0054         local I2_HI = 1; // value to indicate I2 variable is supposed to be high
0055         local Delay_424 = Delay_426 = 0; // delayed values for low wire signal
0056         local Delay_444 = Delay_446 = 0; // delayed values for high wire signal
0057         local Delay_464 = Delay_466 = 0; // delayed values for center wire signal
0058         local HI_FS_432, LO_FS_452, AND_out470, CENTER_FS_478; // signal values
0059
0060         // monitoring loop starts on the next line
0061         while (done == FALSE)
0062         {
0063             // get vhi and vlo from sensor reads
0064             ReadSensor(SENSOR402, LO, &vlo); // get vlo from sensor 402
0065             ReadSensor(SENSOR402, HI, &vhi); // get vhi from sensor 402
0066             // calculate diff and sum values
0067             diff_410 = vhi - vlo;
0068             sum_416 = vhi + vlo;
0069
0070             // update low and high threshold values
0071             LVT_412 = Get_LVT( );
0072             HVT_414 = Get_HVT( );
0073
0074             // Determine Hi Wire Fault Signal 432
0075             HI_FS_432 = Get_FS(diff_410, LVT_412, I2_LOW, &Delay_424, &Delay_426);
0076
0077             // Determine Low Wire Fault Signal 452
0078             LO_FS_452 = Get_FS(diff_410, HVT_414, I2_HIGH, &Delay_444, &Delay_446);
0079
0080             // Determine output of AND gate 470
0081             ANDout_470 = Get_FS(sum_416, LVT_412, I2_LOW, &Delay_464, &Delay_466);
0082
0083             // Get value for Center Wire Fault Signal 478 (functionality of AND gate 476)
0084             CENTER_FS_478 = (!HI_FS_432) && (!LO_FS_452) && ANDout_470;
0085
0086             // in some embodiments, next if statement can be used to log occurrence of a raised
0087             // High FS, Low FS, or Center FS to save indication of (possible) intermittent fault
0088             if ((HI_FS_432 == TRUE) || (LO_FS_452 == TRUE) ||
0089                 (CENTER_FS_478 == TRUE))
0090             {
0091                 // save signals in log, perhaps with other data (e.g., timestamp, sensor IDs, etc.)
0092                 Log_Signal(HI_FS_432);
0093                 Log_Signal(LO_FS_452);
0094                 Log_Signal(CENTER_FS_478);
0095             } // end of if statement
0096             // in other embodiments, can check / log each signal separately
0097
0098             done = done_yet( ); // determine if done with monitoring loop
0099         } // end of the while loop
0100 }// end of SW_monitor function
0101
0102 main( ) // the main routine
```

TABLE 1-continued

```
0103 {
0104         SW_monitor( ); // just run the sensor wiring monitor routine.
0105         // main can be more complex in other embodiments
0106 } // end of main routine
```

The execution of instructions of Table 1 above can begin with the main routine starting at line 0102. The main routine has one instruction—a call to a SW_monitor function at line 0104. The SW_monitor function, which has no parameters, begins at line 0047 of Table 1. After initializing several variables at lines 0050-0058, the SW_monitor function can execute a while loop that starts at line 0061 and ends at line 0099.

An iteration of the while loop begins on line 0064 with a call to a ReadSensor function to read sensor 402's low voltage value and store the low voltage value in the "vlo" variable. In this example, the ReadSensor function is assumed to be provided by an operating system and/or other software of data processing system 500 for interacting with sensors such as but not necessarily limited to, sensors 130, 132, 134, 200, 402, and 530. The example ReadSensor function takes three parameters: a sensor parameter to identify a sensor to be read, a read-type parameter to identify one or more values of the sensor to be read, and an output value parameter to store the value(s) read from the sensor. For this example, the read-type parameter can take at least two values: "HI" to read a high voltage ($V_{hi}$) value of an LVDT sensor and "LO" to read a low voltage value ($V_{lo}$) of the LVDT sensor, where the LVDT sensor can be, but is not limited to, at least one of sensors 130, 132, 134, 200, 402, and 530. In other examples, the ReadSensor function could be used to read other data from one or more sensors.

Then, on line 0065, the ReadSensor function is called to read sensor 402's high voltage value and store the high voltage value in the "vhi" variable. On line 0067, the difference of the high and low voltage values is calculated ($V_{hi}-V_{lo}$) and stored in the "diff_410" variable, corresponding to summing junction 418 generating the diff 410 value as shown in FIG. 4. On line 0068, the sum of the high and low voltage values is calculated ($V_{hi}+V_{lo}$) and stored in the "sum 416" variable, corresponding to summing junction 416 generating the sum 416 value as shown in FIG. 4.

Low voltage threshold 412 and high voltage threshold 414, respectively, are determined on lines 0071 and 0072. The low voltage threshold is determined using the Get_LVT function, which is shown on lines 0034-0038 of Table 1. The example Get_LVT function returns a constant value of 1.0; in other embodiments, Get_LVT can be more complex; e.g., the value returned by Get_LVT can be based on: information about a position and/or other condition(s) of an assembly being monitored, such as an actuator; information about previous low voltage values; e.g., an average and/or minimum voltage value observed while sensor 402 is operating without fault, and/or other information.

The example Get_HVT function shown on lines 0040-0044 of Table 1 returns a constant value of 6.0. In other embodiments, Get_HVT can be more complex; e.g., the value returned by Get_HVT can be based on: information about a position and/or other condition(s) of an assembly being monitored, such as an actuator; information about previous high voltage values; e.g., based on an average and/or maximum voltage value observed while sensor 402 is operating without fault, and/or other information.

The while loop of the SW_monitor function continues on line 0075 with a call to the Get_FS function to determine a high wire fault signal; e.g., high wire fault signal 432 of FIG. 4, where the return value of the Get_FS function is stored in a "HI_FS_432" variable. The Get_FS function is shown on lines 0002-0026 of Table 1.

The Get_FS function takes five parameters: values I1 and I2, such as shown in comparators 420, 422, 440, 442, 460, and 462 of FIG. 4, an I2_type parameter, and two delay value parameters: Delay1 and Delay2. Utilizing C-style syntax, the Delay1 and Delay2parameters are preceded by an asterisk "*" to indicate that using the terminology "*Delay1" or "*Delay2" in Get_FS will change the value of the respective Delay1 or Delay2 parameter after termination of the Get_FS function.

At line 0006, the Get_FS function compares the I2_type parameter to 0, to see if the I2 value represents a low value, such as indicated by comparators 420, 422, 460, and 462 of FIG. 4, or a high value, such as indicated by comparator 440 and 442 of FIG. 4. If I2_type equals 0, then the I2 value represents a low value; otherwise the I2 value represents a high value. If the I2 value represents a low value, lines 0011 and 0012 are executed, where a value of a compare1 variable is set to the output of a comparison determining whether the I1 value is greater than or equal to I2, and where a value of a compare2 variable is set to the output of a comparison determining whether the I1 value is less than or equal to I2. Alternatively, if the I2 value represents a high value, lines 0014 and 0015 are executed, where the value of compare1 is set to the output of a comparison determining whether the I2 value is greater than or equal to I1, and where the value of compare2 is set to the output of a comparison determining whether the I1 value is greater than or equal to I2.

Then, line 0019 can be executed to perform the functionality of one of respective OR gates 428, 448, and 468 of FIG. 4 by performing a logical OR operation on the Delay1 and Delay2 values, where Delay1 corresponds to the output of respective delay 424, 444, and 464, and Delay2 corresponds to the output of respective delay 426, 446, and 466, and then by storing the output of the logical OR operation in an OR_out value. Then, the respective delay function 426, 446, and 466 is simulated on line 0020 by saving the value of Delay1 as the value of Delay2, and the respective delay function 424, 444, and 464 is simulated on line 0021 by saving the value of compare1 as the value of Delay1.

At line 0024, the functionality of one of respective AND gates 428, 448, and 468 of FIG. 4 is carried out by taking a logical AND of the values of the OR_out and compare2 variables, and storing the logical AND output as a value of an AND_out variable. The value of the AND_out variable is returned on line 0025 as the return value of the Get_FS function.

After the Get_FS function called on line 0075 returns, control returns back to the while loop of the SW_monitor function, which continues on line 0078 with a call to the Get_FS function to perform a comparison between diff_410 and HVT_414 variables with HVT_414 representing a high value to determine a low wire fault signal; e.g., low wire fault signal 452 of FIG. 4, where the return value of the Get_FS function is stored in a "LO_FS_452" variable. Then, after the Get_FS call, line 0081 can be executed, which involves another call to the Get_FS function to compare sum_416 and LVT_412 variables with LVT_412 representing a low value to determine the value output by AND gate 470 of FIG. 4 and storing that output in an ANDout_470 variable.

At line 0084, a value of center fault signal 478 is determined by taking a logical AND of: (1) a negation of the value of the HI_FS_432 variable, (2) a negation of the value of the LO_FS_452 variable, and (3) the value of the ANDout_470, and storing the value of this logical AND in a CENTER_FS_478 value.

At lines 0088 and 0089, each of the HI_FS_432, LO_FS_452, and CENTER_FS_478 values are compared with a logical TRUE value, and if any of the HI_FS_432, LO_FS_452, and CENTER_FS_478 variables have a logical TRUE value, then a Log_Signal function is called to log and/or otherwise store of all three of the HI_FS_432, LO_FS_452, and CENTER_FS_478 variables and perhaps other information in a log file or other record(s). The other information can include, but is not limited to, a timestamp, additional timing information, sensor identifier(s), actuator identifier(s), and/or aircraft identifier(s). Other data can be logged as well or instead; e.g., voltage data from the sensor values, and failure threshold check/delayed failure threshold check values. In other embodiments, only a fault signal with a logical TRUE value is logged rather than logging all three of the HI_FS_432, LO_FS_452, and CENTER_FS_478 variables as shown in Table 1.

At line 0098, the done_yet function shown at lines 0028-0032 is called by the SW_monitor function to set a new value of the done variable controlling the while loop. In this example, the done_yet function always returns a logical FALSE value, and so the while loop is effectively an infinite loop to provide continuous monitoring of the wiring of sensor, just as can be provided by sensor wiring monitor 400.

In some embodiments, fewer wires, such as only the high and low wires, can be monitored by sensor wiring monitor 400 and the pseudo-code in Table 1 can be modified in accord. For example, in those embodiments, the pseudo-code shown in Table 1 above can be modified by removing references to sum_416, Delay_464, Delay_466, ANDout_470, and CENTER_FS_478 variables, removing the instructions (and perhaps the comments) between lines 0080 and 0085, modifying the if statement starting on line 0087 to remove the OR and comparison operations related to CENTER_FS_478, and removing the Log_Signal call on line 0094.

Figure 6:
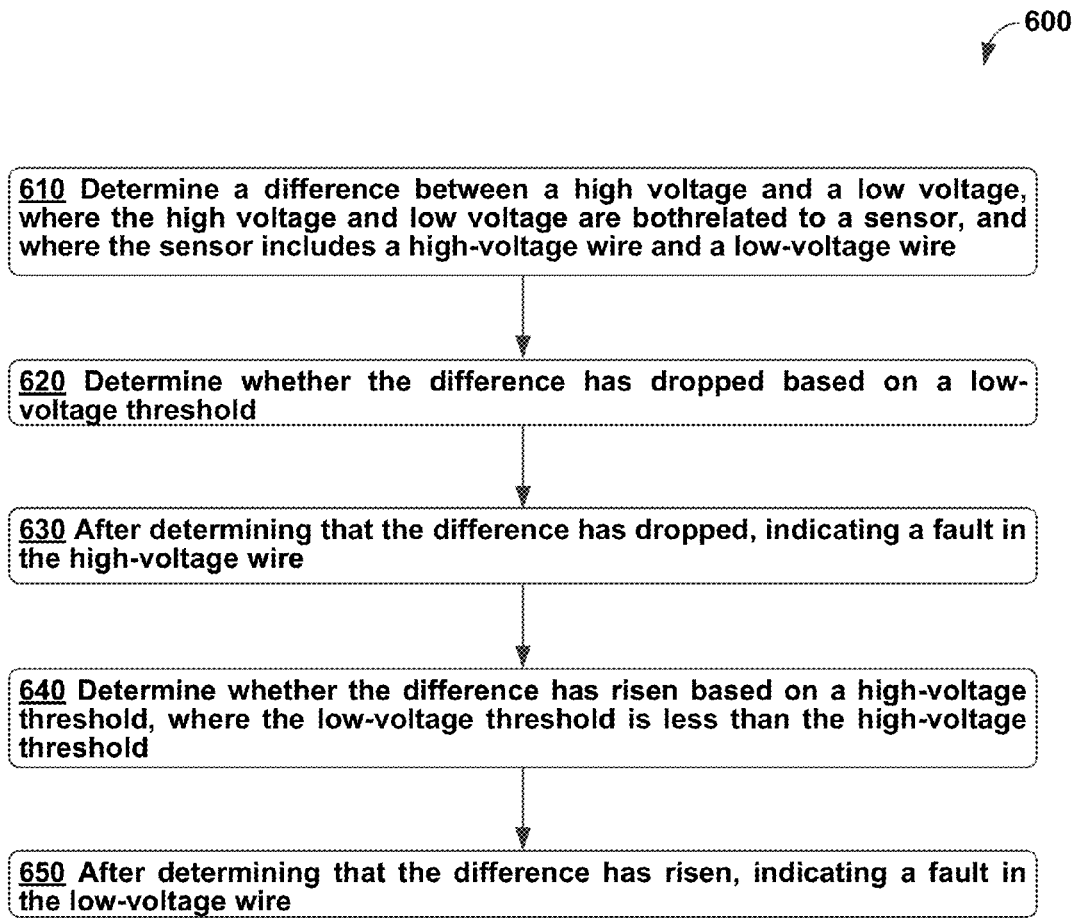
FIG. 6 is a flowchart of a method for detecting faults in excitation wiring, according to an example embodiment.

FIG. 6 is a flowchart of method 600 for detecting faults in sensor wiring, according to an example embodiment. Method 600 shown in FIG. 6 presents an embodiment that can be performed within the embodiments of FIGS. 1-5, for example. Thus, devices and systems disclosed herein can be used or configured to perform logical functions presented in FIG. 6. In some instances, components of the devices and systems can be configured to perform the functions such that the components are actually configured and structured (with hardware and/or software) to enable such performance. In other examples, components of the devices and systems can be arranged to be adapted to, capable of, or suited for performing the functions.

Method 600 can include one or more operations, functions, or actions as illustrated by herein-described blocks of FIG. 6. Although the blocks are illustrated in a sequential order, these blocks may also be performed in parallel, and/or in a different order than described herein. Also, the various blocks may be combined into fewer blocks, divided into additional blocks, and/or removed based upon the desired implementation. In some embodiments, method 600 can be carried out by circuitry, such as sensor wiring monitor 400, while in other embodiments, method 600 can be carried out by a data processing system, such as data processing system 500, executing computer-executable instructions configure to perform the functions of method 600; e.g., computer-executable instructions that are the same as or similar to the pseudo-code shown in Table 1.

Method 600 can begin at block 610, where a difference between a high voltage and a low voltage can be determined. The high voltage and the low voltage can both be related to a sensor, where the sensor can include a high-voltage wire and a low-voltage wire.

At block 620, a determination can be made whether the difference has dropped based on a low-voltage threshold.

In some embodiments, determining whether the difference has dropped can include: generating a first logical value indicating whether the low-voltage threshold is less than the difference; generating a second logical value indicating whether the difference is greater than the low-voltage threshold; generating one or more delayed first logical values by delaying the first logical value by one or more time intervals; and determining whether the difference has dropped based on a logical combination of the one or more delayed first logical values and the second logical value. In particular of these embodiments, the logical combination of the one or more delayed first logical values and the second logical value can include a logical AND.

At block 630, after determining that the difference has dropped, a fault in the high-voltage wire can be indicated.

At block 640, a determination can be made whether the difference has risen based on a high-voltage threshold, where the low-voltage threshold can be less than the high-voltage threshold.

In some embodiments, determining whether the difference has risen can include: generating a third logical value indicating whether the high-voltage threshold is greater than the difference; generating a fourth logical value indicating whether the difference is less than the high-voltage threshold; generating one or more delayed third logical values by delaying the third logical value by one or more time intervals; and determining whether the difference has dropped based on a logical combination of the one or more delayed third logical values and the fourth logical value. In particular of these embodiments, the logical combination of the one or more delayed third logical values and the fourth logical value includes a logical AND.

At block 650, after determining that the difference has risen, a fault in the low-voltage wire can be indicated.

In some embodiments, the sensor can further include a center wire. In particular of these embodiments, method 600 can further include: determining a sum of the high voltage and the low voltage; determining whether the difference has not dropped and has not risen; determining whether the sum has dropped based on a low-sum threshold; and after determining that both the difference has not dropped and has not risen and the sum is less than the low-sum threshold, indicating a fault in the center wire. In more particular of these embodiments, determining whether the sum has dropped can include: generating a fifth logical value indicating whether the low-sum threshold is less than the sum; generating a sixth logical value indicating whether the sum is greater than the low-sum threshold; generating one or more delayed fifth logical values by delaying the fifth logical value by one or more time intervals; and determining whether the sum has dropped based on a logical combination of the one or more delayed fifth logical values and the sixth logical value. In still more particular of these embodiments, the logical combination of the one or more delayed fifth logical values and the sixth logical value includes a logical AND.

In even other embodiments, the sensor can be associated with an actuator. In particular of these embodiments, the actuator can be configured to move a swashplate of an aircraft.

Disclosed embodiments are described above with reference to the accompanying drawings, in which some, but not all of the disclosed embodiments may be shown. Indeed, several different embodiments may be described and should not be construed as limited to the embodiments set forth herein. Rather, these embodiments are described so that this disclosure are thorough and complete and convey the disclosure at least to those skilled in the art.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent from the foregoing descriptions. Such modifications and variations are intended to fall within the scope of the appended claims.

It should be understood that for the processes and methods disclosed herein, flowcharts show functionality and operation of possible implementations of respective embodiments. In this regard, each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block in the disclosed flowcharts may represent circuitry that is wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:
1. A method of detecting sensor wiring faults, comprising:
providing at least a high voltage and a low voltage from a wiring sensor to a sensor wiring monitor,
wherein the high voltage is provided to the sensor wiring monitor using a high-voltage wire connected to the wiring sensor, and
wherein the low voltage is provided to the wiring sensor wiring monitor using a low-voltage wire connected to the wiring sensor;
determining a difference between the high voltage and the low voltage;
determining whether the difference has dropped based on a low-voltage threshold;
after determining that the difference has dropped, indicating a fault in the high-voltage wire;
determining whether the difference has risen based on a high-voltage threshold, wherein the low-voltage threshold is less than the high-voltage threshold; and
after determining that the difference has risen, indicating a fault in the low-voltage wire.
2. The method of claim 1, wherein determining whether the difference has dropped comprises:
generating a first logical value indicating whether the low-voltage threshold is less than the difference;
generating a second logical value indicating whether the difference is greater than the low-voltage threshold;
generating one or more delayed first logical values by delaying the first logical value by one or more time intervals; and
determining whether the difference has dropped based on a logical combination of the one or more delayed first logical values and the second logical value.
3. The method of claim 2, wherein the logical combination of the one or more delayed first logical values and the second logical value comprises a logical AND.
4. The method of claim 1, wherein determining whether the difference has risen comprises:
generating a third logical value indicating whether the high-voltage threshold is greater than the difference;
generating a fourth logical value indicating whether the difference is less than the high-voltage threshold;
generating one or more delayed third logical values by delaying the third logical value by one or more time intervals; and
determining whether the difference has dropped based on a logical combination of the one or more delayed third logical values and the fourth logical value.
5. The method of claim 4, wherein the logical combination of the one or more delayed third logical values and the fourth logical value comprises a logical AND.
6. The method of claim 1, wherein the wiring sensor further comprises a center wire.
7. The method of claim 6, further comprising:
determining a sum of the high voltage and the low voltage;
determining whether the difference has not dropped and has not risen;
determining whether the sum has dropped based on a low-sum threshold; and
after determining that both the difference has not dropped and has not risen and the sum is less than the low-sum threshold, indicating a fault in the center wire.
8. The method of claim 7, wherein determining whether the sum has dropped comprises:
generating a fifth logical value indicating whether the low-sum threshold is less than the sum;

generating a sixth logical value indicating whether the sum is greater than the low-sum threshold;

generating one or more delayed fifth logical values by delaying the fifth logical value by one or more time intervals; and determining whether the sum has dropped based on a logical combination of the one or more delayed fifth logical values and the sixth logical value.

9. The method of claim 8, wherein the logical combination of the one or more delayed fifth logical values and the sixth logical value comprises a logical AND.

10. The method of claim 1, wherein the transducer is associated with an actuator.

11. The method of claim 10, wherein the actuator is configured to move a swashplate of an aircraft.

12. A device, comprising circuitry, the circuitry including:

a wiring sensor, configured at least to provide a high voltage and a low voltage;

a high-voltage wire;

a low-voltage wire;

a sensor wiring monitor, wherein the high voltage is provided from the wiring sensor to the sensor wiring monitor via the high-voltage wire, and wherein the low voltage is provided from the wiring sensor to the sensor wiring monitor via the low-voltage wire;

wherein the circuitry is configured for:

determining a difference between a high voltage and a low voltage;

determining whether the difference has dropped based on a low-voltage threshold;

after determining that the difference has dropped, indicating a fault in the high-voltage wire;

determining whether the difference has risen based on a high-voltage threshold, wherein the low-voltage threshold is less than the high-voltage threshold; and after determining that the difference has risen, indicating a fault in the low-voltage wire.

13. The device of claim 12, wherein determining whether the difference has dropped comprises:

generating a first logical value indicating whether the low-voltage threshold is less than the difference;

generating a second logical value indicating whether the difference is greater than the low-voltage threshold;

generating one or more delayed first logical values by delaying the first logical value by one or more time intervals; and determining whether the difference has dropped based on a logical combination of the one or more delayed first logical values and the second logical value.

14. The device of claim 12, wherein determining whether the difference has risen comprises:

generating a third logical value indicating whether the high-voltage threshold is greater than the difference;

generating a fourth logical value indicating whether the difference is less than the high-voltage threshold;

generating one or more delayed third logical values by delaying the third logical value by one or more time intervals; and determining whether the difference has dropped based on a logical combination of the one or more delayed third logical values and the fourth logical value.

15. The device of claim 12, wherein the circuitry further comprises a center wire, and wherein the circuitry is further configured for:

determining a sum of the high voltage and the low voltage;

determining whether the difference has not dropped and has not risen;

determining whether the sum has dropped based on a low-sum threshold; and after determining that both the difference has not dropped and has not risen and the sum is less than the low-sum threshold, indicating a fault in the center wire.

16. The device of claim 15, wherein determining whether the sum has dropped comprises:

generating a fifth logical value indicating whether the low-sum threshold is less than the sum;

generating a sixth logical value indicating whether the sum is greater than the low-sum threshold;

generating one or more delayed fifth logical values by delaying the fifth logical value by one or more time intervals; and determining whether the sum has dropped based on a logical combination of the one or more delayed fifth logical values and the sixth logical value.

17. The device of claim 12, wherein the circuitry is associated with an actuator that is configured to move a swashplate of an aircraft.

18. A computing device, comprising:

one or more processors; and computer readable media configured to store at least program code that, when executed by the one or more processors, causes the computing device to perform functions comprising:

determining a difference between a high voltage and a low voltage, wherein the high voltage and the low voltage are both related to a sensor, and wherein the sensor comprises a high-voltage wire and a low-voltage wire;

determining whether the difference has dropped based on a low-voltage threshold;

after determining that the difference has dropped, indicating a fault in the high-voltage wire;

determining whether the difference has risen based on a high-voltage threshold, wherein the low-voltage threshold is less than the high-voltage threshold; and after determining that the difference has risen, indicating a fault in the low-voltage wire.

19. The computing device of claim 18, wherein the sensor further comprises a center wire, and wherein the functions further comprise:

determining a sum of the high voltage and the low voltage;

determining whether the difference has not dropped and has not risen;

determining whether the sum has dropped based on a low-sum threshold; and after determining that both the difference has not dropped and has not risen and the sum is less than the low-sum threshold, indicating a fault in the center wire.

20. The computing device of claim 18, wherein the sensor is associated with an actuator that is configured to move a swashplate of an aircraft.

* * * * *